United States Patent
Chang et al.

(10) Patent No.: US 9,953,907 B2
(45) Date of Patent: Apr. 24, 2018

(54) POP DEVICE

(71) Applicant: Taiwan Semiconductor Manufacturing Company, Ltd., Hsin-Chu (TW)

(72) Inventors: Chin-Chuan Chang, Zhudong Township (TW); Jing-Cheng Lin, Hsin-Chu (TW); Nai-Wei Liu, Fengshan (TW); Wan-Ting Shih, Touwu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 13/753,204

(22) Filed: Jan. 29, 2013

(65) Prior Publication Data
US 2014/0210080 A1 Jul. 31, 2014

(51) Int. Cl.
*H01L 25/10* (2006.01)
*H01L 25/11* (2006.01)
(Continued)

(52) U.S. Cl.
CPC ........ *H01L 23/49816* (2013.01); *H01L 21/50* (2013.01); *H01L 21/568* (2013.01);
(Continued)

(58) Field of Classification Search
CPC ..... H01L 25/10; H01L 25/117; H01L 25/162; H01L 25/0657; H01L 23/5386; H01L 23/538; H01L 2224/80001
(Continued)

(56) References Cited

U.S. PATENT DOCUMENTS 5,841,193 A 11/1998 Eichelberger
6,034,441 A 3/2000 Chen
(Continued)

FOREIGN PATENT DOCUMENTS

TW 200532880 A 10/2005
TW 201007924 A 2/2010
(Continued)

OTHER PUBLICATIONS

Zhaozhi, Li, et al., "Design, processing and reliability characterizations of a 3D-WLCSP packaged component," 59th Electronic Components and Technology Conference (ECTC 2009). May 26-29, 2009, pp. 972-979. doi: 10.1109/ECTC.2009.5074131.
(Continued)

*Primary Examiner* — David Zarneke
(74) *Attorney, Agent, or Firm* — Slater Matsil, LLP

(57) ABSTRACT

A method of forming a PoP device comprises placing an adhesive layer on a carrier substrate, coupling a plurality of chip packages to the adhesive layer on the carrier substrate, placing a bonding layer on the chip packages, and coupling a plurality of chips to the bonding layer on the chip packages. The method further comprises injecting a molding compound to encapsulate the chip packages and the chips on the carrier substrate, grinding the molding compound to expose a plurality of connecting elements of the chips and a plurality of second connecting elements of the chip packages, forming a redistribution layer (RDL) on the molding compound and the exposed connecting elements and second connecting elements, forming a ball grid array (BGA) on the RDL, and de-bonding the carrier substrate.

19 Claims, 5 Drawing Sheets

(51) Int. Cl.
| | | |
|---|---|---|
| *H01L 25/16* | (2006.01) | |
| *H01L 25/065* | (2006.01) | |
| *H01L 23/538* | (2006.01) | |
| *H01L 23/498* | (2006.01) | |
| *H01L 21/50* | (2006.01) | |
| *H01L 21/56* | (2006.01) | |
| *H01L 23/00* | (2006.01) | |
| *H01L 25/03* | (2006.01) | |
| *H01L 25/00* | (2006.01) | |

(52) U.S. Cl.
CPC .... *H01L 23/49822* (2013.01); *H01L 23/5389* (2013.01); *H01L 24/19* (2013.01); *H01L 24/96* (2013.01); *H01L 24/97* (2013.01); *H01L 25/03* (2013.01); *H01L 25/50* (2013.01); *H01L 23/538* (2013.01); *H01L 23/5386* (2013.01); *H01L 24/73* (2013.01); *H01L 25/0657* (2013.01); *H01L 25/10* (2013.01); *H01L 25/117* (2013.01); *H01L 25/162* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/80001* (2013.01); *H01L 2224/92244* (2013.01); *H01L 2224/97* (2013.01); *H01L 2225/0651* (2013.01); *H01L 2225/06568* (2013.01); *H01L 2924/12042* (2013.01); *H01L 2924/15311* (2013.01); *H01L 2924/181* (2013.01)

(58) Field of Classification Search
USPC .......................................................... 257/686
See application file for complete search history.

(56) References Cited

U.S. PATENT DOCUMENTS

| | | | |
|---|---|---|---|
| 6,326,700 B1 | 12/2001 | Bai et al. | |
| 6,462,414 B1 | 10/2002 | Anderson | |
| 6,558,848 B1 | 5/2003 | Kobayashi et al. | |
| 7,084,513 B2 | 8/2006 | Matsuki et al. | |
| 7,262,082 B1 | 8/2007 | Lin et al. | |
| 7,435,619 B2* | 10/2008 | Shim et al. | 438/107 |
| 7,960,827 B1* | 6/2011 | Miller et al. | 257/712 |
| 8,035,213 B2* | 10/2011 | Lee et al. | 257/692 |
| 8,368,222 B2* | 2/2013 | Okuyama | H01L 24/06 257/758 |
| 8,436,462 B2* | 5/2013 | Kim et al. | 257/693 |
| 8,466,567 B2 | 6/2013 | Choi et al. | |
| 8,508,954 B2* | 8/2013 | Kwon et al. | 361/790 |
| 8,552,556 B1* | 10/2013 | Kim et al. | 257/738 |
| 8,643,163 B2* | 2/2014 | Shim et al. | 257/686 |
| 8,736,065 B2 | 5/2014 | Gonzalez et al. | |
| 8,810,024 B2* | 8/2014 | Lin | H01L 23/13 257/621 |
| 8,823,180 B2 | 9/2014 | Wang et al. | |
| 8,884,418 B2* | 11/2014 | Camacho et al. | 257/686 |
| 8,884,422 B2* | 11/2014 | Goh et al. | 257/690 |
| 8,901,724 B2 | 12/2014 | Guzek et al. | |
| 2004/0178499 A1 | 9/2004 | Mistry et al. | |
| 2005/0012195 A1 | 1/2005 | Go et al. | |
| 2007/0063332 A1 | 3/2007 | Go et al. | |
| 2007/0216005 A1* | 9/2007 | Yim et al. | 257/686 |
| 2008/0197173 A1 | 8/2008 | Kitae et al. | |
| 2009/0014858 A1 | 1/2009 | Boon et al. | |
| 2009/0152700 A1* | 6/2009 | Kuan et al. | 257/686 |
| 2009/0166835 A1* | 7/2009 | Yang et al. | 257/686 |
| 2009/0250822 A1* | 10/2009 | Chen et al. | 257/777 |
| 2010/0012325 A1* | 1/2010 | Friedemann | 166/335 |
| 2010/0032822 A1 | 2/2010 | Liao et al. | |
| 2010/0133704 A1* | 6/2010 | Marimuthu et al. | 257/778 |
| 2010/0140779 A1* | 6/2010 | Lin et al. | 257/690 |
| 2010/0213600 A1* | 8/2010 | Lau | H01L 23/055 257/693 |
| 2010/0283085 A1* | 11/2010 | Bemanian et al. | 257/209 |
| 2011/0047906 A1 | 3/2011 | Fitzpatrick | |
| 2011/0068427 A1 | 3/2011 | Paek et al. | |
| 2011/0147906 A1 | 6/2011 | Yang et al. | |
| 2011/0215464 A1* | 9/2011 | Guzek et al. | 257/737 |
| 2011/0233755 A1* | 9/2011 | Kim et al. | 257/693 |
| 2011/0278707 A1* | 11/2011 | Chi et al. | 257/676 |
| 2011/0285007 A1* | 11/2011 | Chi et al. | 257/686 |
| 2011/0291889 A1 | 12/2011 | Mayo | |
| 2011/0298119 A1* | 12/2011 | Cho et al. | 257/686 |
| 2012/0181673 A1 | 7/2012 | Pagaila et al. | |
| 2013/0210198 A1 | 8/2013 | Lin | |
| 2013/0292828 A1 | 11/2013 | Kwon et al. | |
| 2014/0054760 A1* | 2/2014 | Yu et al. | 257/692 |
| 2014/0077369 A1 | 3/2014 | Liang et al. | |
| 2014/0159233 A1* | 6/2014 | Lin et al. | 257/737 |
| 2014/0248742 A1 | 9/2014 | Gonzalez et al. | |

FOREIGN PATENT DOCUMENTS

| | | |
|---|---|---|
| TW | 201131735 A | 9/2011 |
| TW | 201236128 A | 9/2012 |
| TW | 201246499 A | 11/2012 |
| WO | 2005057652 A2 | 6/2005 |

OTHER PUBLICATIONS

Kumar, A., et al., "Wafer level embedding technology for 3D wafer level embedded package," 59th Electronic Components and Technology Conference (ECTC 2009). May 26-29, 2009, pp. 1289-1296. doi: 10.1109/ECTC.2009.5074177.

Motohashi, N., et al., "SMAFTI package with planarized multilayer interconnects," 59th Electronic Components and Technology Conference (ECTC 2009). May 26-29, 2009, pp. 599-606. doi: 10.1109/ECTC.2009.5074074.

Microstructures Lab, "Wet-Etching", Electrical Computer & Engineering: University of Colorado Boulder, Jan. 24, 2011, 7 pages.

* cited by examiner

1. Adhesive layer coating

2. Chip 1 placement

3. Chip 2 placement

4. Molding

POP DEVICE

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. The devices are made from semiconductor materials, such as silicon. The IC chips can be assembled into a package, such as a quad flat pack (QFP), a pin grid array (PGA), or a ball grid array (BGA), for example using wire bonding (WB), tape automated bonding (TAB), or flip chip (FC) bumping assembly techniques. A packaged device is attached either directly to a printed wiring board or to another type of substrate, which is defined as a second level of packaging.

In BGA packaging technology, a semiconductor or IC chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory component such as Dynamic Random Access Memory (DRAM) and other memory devices.

Package-on-Package (PoP) is an integrated circuit packaging technique to allow vertically combining, for example, discrete logic and memory BGA packages. Two or more packages are installed on top of one another, e.g. stacked, with a standard interface to route signals between them. This allows higher density, for example in the mobile telephone/smartphone market.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Described herein are embodiments of a PoP device with a three-dimensional (3D) fan-out structure and a method for forming the PoP device. For example, the PoP device with the 3D fan-out structure may be a memory device or component. The PoP device may comprise a chip package, such as a PoP die and an embedded chip both encapsulated in a molding compound, a BGA, and a redistribution layer (RDL) for coupling the encapsulated PoP die and embedded chip to the BGA to achieve a 3D fan-out structure. The embedded chip may be bonded to a surface of the PoP die using an adhesive layer or a thermal interface material (TIM).

The RDL may allow electrical coupling between the BGA and interconnects of the encapsulated PoP die and embedded chip, thus achieving a fan-out structure without using or forming through vias, such as Through-Silicon vias (TSVs) or Through-Mold vias (TMVs). The RDL can be used for interconnecting the BGA and the encapsulated PoP die and embedded chip instead of a laminate interconnection layer, which is typically formed with TSVs or other interconnect structures to electrically couple a die or package to a BGA. Since a laminate interconnection layer is typically thicker than a RDL, replacing a laminate interconnection layer with a RDL reduces the vertical dimension of the device, i.e., the thickness of the PoP device, which may be beneficial and more suitable for compact electronic devices. Additionally, using a RDL instead of a laminate interconnection layer removes the need for forming vias (e.g., TSVs) and/or other interconnect structures to couple the BGA to the embedded chip and the chip package, which may simplify and reduce cost of device manufacture.

Embodiments are described herein with respect to a specific context, namely a PoP die, an embedded chip, a RDL, and a BGA that form together a PoP device with a 3D fan-out structure. Other embodiments may also be applied, such as for other fan-out structures where multiple layers of IC chips or packages are stacked vertically and then coupled through a RDL to a BGA or similar interconnect packages.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Figure 1:
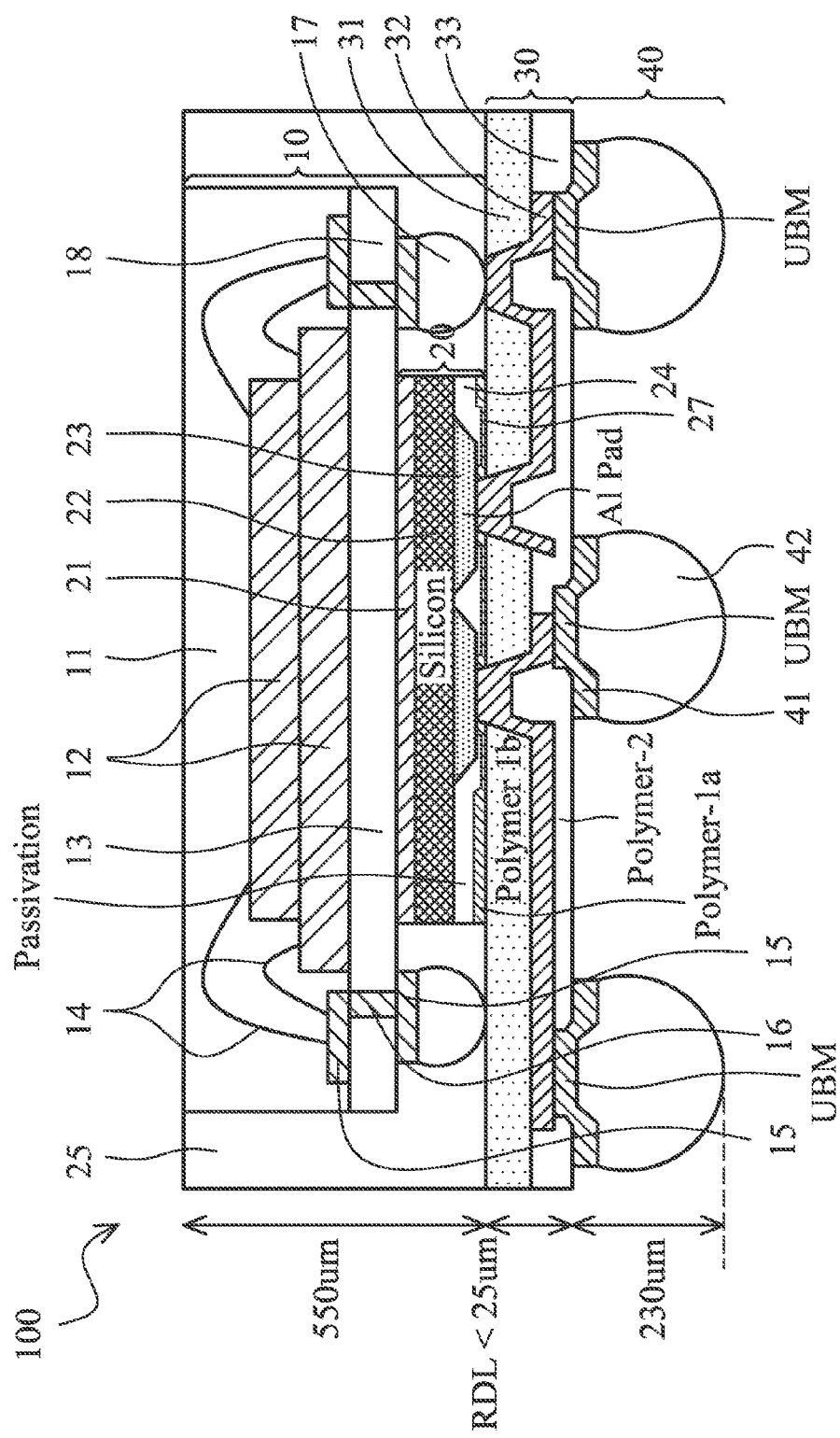
FIG. 1 illustrates a cross section of a PoP device with a 3D fan-out structure according to an embodiment.

FIG. 1 illustrates a cross section of an embodiment of a PoP device 100 having a 3D fan-out structure, according to an embodiment. For example, the PoP device 100 may correspond to a memory device or component, such as a DRAM device or component. The PoP device 100 may comprise a PoP die 10 (or other chip package), an embedded chip 20 coupled to the PoP die 10, a molding compound that encapsulates the PoP die 10 and the embedded chip 20, a RDL 30 coupled to the encapsulated PoP die 10 and embedded chip 20, and a BGA 40 coupled to the RDL 30. The components or layers, above, of the PoP device 100 may be positioned and stacked with respect to one another as shown in FIG. 1.

The PoP die 10 may be formed and obtained using any suitable semiconductor fabrication processes. The PoP die 10 may comprise a plurality of stacked chips 12, which may have different dimensions. The stacked chips 12 may comprise one or more semiconductor layers (e.g., silicon and/or other semiconductor materials), one or more conductive layers, one or more dielectric layers, or combinations thereof. The stacked chips 12 may be encapsulated by a second molding compound 11 and positioned on a substrate 18. For example, the PoP die 10 may include two silicon chips of different dimensions stacked on top of each other on the substrate 18 and surrounded from the top and sides by the second molding compound 11. The two stacked chips 12 and the second molding compound 11 are supported by the substrate 18. The substrate 18 may be, for example, a silicon substrate (such as a silicon chip), a silicon or glass interposer, a printed circuit board (PCB), an organic laminate substrate, or the like.

The PoP die 10 may also comprise a plurality of pads 15, which may be positioned on both sides of the substrate 18 and connected across the substrate 18 through vias 16 (e.g., through vias). The pads 15 on one side of the substrate (on the side of the stacked chips 12) may be connected to the stacked chips 12 through bonding wires 14. The pads 15 on the other side of the substrate 18 (opposite to the stacked chips 12) may be bonded to a plurality of interconnects 17, for instance in the form of solder balls or spheres (e.g., C4 bumps) or, in other embodiments, other suitable bonding structures. The bonding wires 14, pads 15, and vias 16 provide electrical coupling between the stacked chips 12 and the interconnects 17.

The embedded chip 20 may be formed on a surface of the PoP die 10 and may comprise a silicon chip 22 (or other semiconductor chip) and a bonding layer 21 that bonds the silicon chip 22 to the substrate 18 of the PoP die 10. In an embodiment, the bonding layer 21 may be an adhesive layer formed of a glue or a lamination layer formed of a foil. In another embodiment, a TIM may be used as the bonding layer 21 to bond the silicon chip 22 to the substrate 18. The TIM may make contact with the stacked chips 12 using through vias that may be formed in the substrate 18 to provide a thermally conductive connection between the silicon chip 22 and the stacked chips 12. The TIM may be a thermal paste, such as a silicone rubber with thermally-conductive fillers such as aluminum oxide and/or boron nitride.

The embedded chip 20 may also comprise one or more metallic and dielectric layers formed between the silicon chip 22 and the RDL 30. The layers may provide a suitable electrical connection between the silicon chip 22 and the RDL 30 and include a plurality of pads 23 (e.g., aluminum or other suitable metal pads), a passivation (dielectric) layer 24, and a first polymer layer 27, which may be arranged as shown in FIG. 1. The passivation layer 24 and the first polymer layer 27 may be patterned structures (discontinuous across the surface) to allow proper coupling between the pads 15 and the RDL 30.

The RDL 30 may comprise a second polymer layer 31 and a conductive layer 32. The second polymer layer 31 may be a second polymer layer that is formed or deposited onto the first polymer layer 27. The conductive layer 32 may be a metal layer, for example an aluminum, copper, titanium, polysilicon, or gold layer. The RDL 30 may also comprise a third polymer layer 33 formed or deposited onto the conductive layer 32. As described above, the function of the RDL 30 is to provide electrical coupling between the embedded chip 20 and the BGA 40 without the formation of through vias (e.g., TSVs or TMVs). The second polymer layer 31, the conductive layer 32, and the third polymer layer 33 may be patterned to allow proper coupling between the pads 15 and the BGA 40, i.e., through contact with interconnects 17 and the conductive layer 32 that provide the electrical coupling between the pads 15 and the BGA 40. In an embodiment, a plurality of Under-Bump Metallization (UBM) elements 41 may be formed on the surface of the RDL 30 to bond the BGA 40 to the embedded chip 20. The UBM elements 41 may be coupled to surface portions of the third polymer layer 33 and to the conductive layer 32. The BGA 40 includes a plurality of conductive elements 42, such as conductive spheres or micro bumps, which are arranged in an array (or other orderly pattern) and placed in contact with the UBM elements 41.

As described above, the RDL 30 is used to couple the PoP die 10 and the embedded chip 20 to the BGA. As such, the RDL 30 can replace a laminate interconnection layer, which is typically used to bond and electrically couple a chip package to a BGA. Using the RDL 30 instead substantially reduces the overall thickness of the PoP device 100 (in the vertical or top-bottom direction of FIG. 1). For example, the molding compound 25 that encapsulates the PoP die 10 and the embedded chip 20 may have a thickness equal or close to 550 micrometers (μm), the BGA 40 may have a thickness equal or close to 240 μm, and the RDL 30 may have a thickness equal or close to about 25 μm, while a typical thickness of a laminate interconnection layer is around 500 μm or more. Thus, using the RDL 30 reduces the overall thickness of the 3D fan-out structure from about 1,400 μm to about 800 μm, i.e., a reduction of more than 40 percent. The reduced thickness of the structure enables better packaging and integration for smaller devices, such as in smartphones, computer tablets, laptops, or other consumer devices. Further, the RDL 30 provides the electrical coupling between the components of the 3D fan-out structure (the PoP device 100) without the formation of through vias, which facilitates fabrication and reduces cost.

Figure 2A:
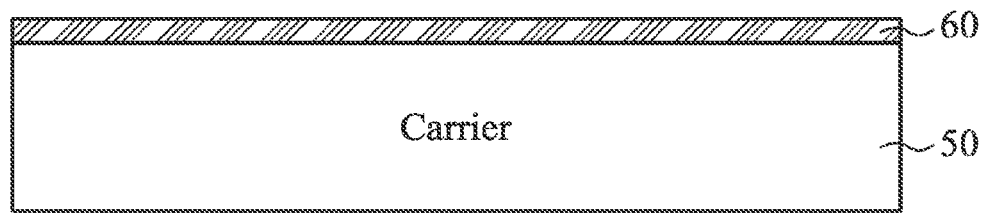
FIGS. 2a through 2h illustrate a process of forming the PoP device of FIG. 1 according to an embodiment.

FIGS. 2a through 2h illustrate a process to form the PoP device 100 according to an embodiment. Although this embodiment is discussed with steps performed in a particular order, steps may be performed in any logical order. FIG. 2a illustrates an adhesive layer coating step, where an adhesive layer 60 may be disposed, for example laminated, on the carriers 50. The adhesive layer 60 may be formed of a glue or may be a lamination layer formed of a foil. The carrier 50 may be any suitable substrate that provides (during intermediary steps of the fabrication process) mechanical support for carrying a plurality of stacked layers of the 3D fan-out structure. The carrier 50 may be, for example, a silicon substrate, a silicon or glass interposer, a PCB, an organic laminate substrate, or the like.

Figure 2B:
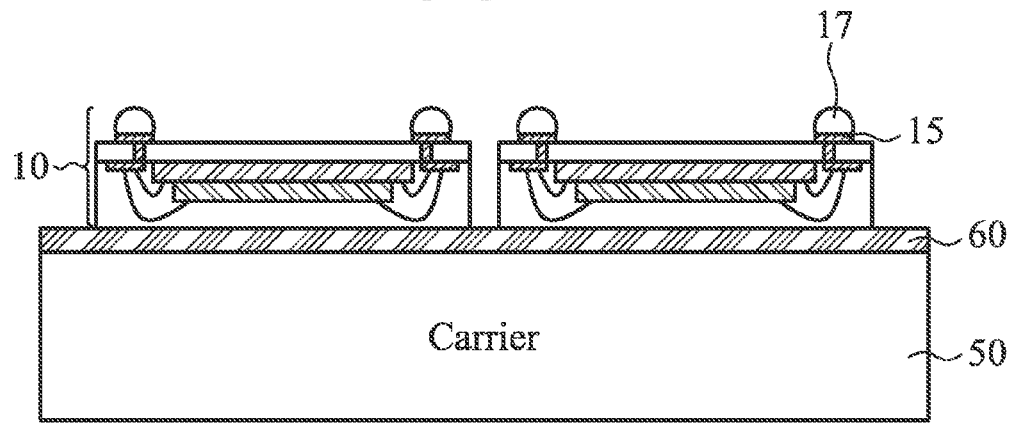

FIG. 2b illustrates a first chip placement step, where a plurality of PoP dies 10, e.g., an array of PoP dies 10, may be placed on the adhesive layer 60. In other embodiments, other types of chip packages may be placed on the adhesive layer 60. The PoP dies 10 may be formed on the adhesive layer 60 or placed using any suitable method of placing the PoP dies 10 onto the adhesive layer 60 and integrating the PoP dies 10 into a manufacturing process flow. In one embodiment, the PoP dies 10 (without the interconnects 17) may be attached to a transfer layer or substrate (not shown). The transfer layer may be utilized to place the PoP dies 10 over the adhesive layer 60, e.g., using a flip-chip process. The placement of the PoP dies 10 may be performed by flipping the transfer layer (with the PoP dies 10 attached) and positioning the PoP dies 10 properly onto the adhesive layer 50. The transfer layer may be removed after the PoP dies 10 have been flipped and placed on the adhesive layer 50, for instance using a stripping or etching process to remove the material of the transfer layer from PoP dies 10. The interconnects 17 may then be placed with the pads 15 on the surface of the PoP dies 10.

Figure 2C:
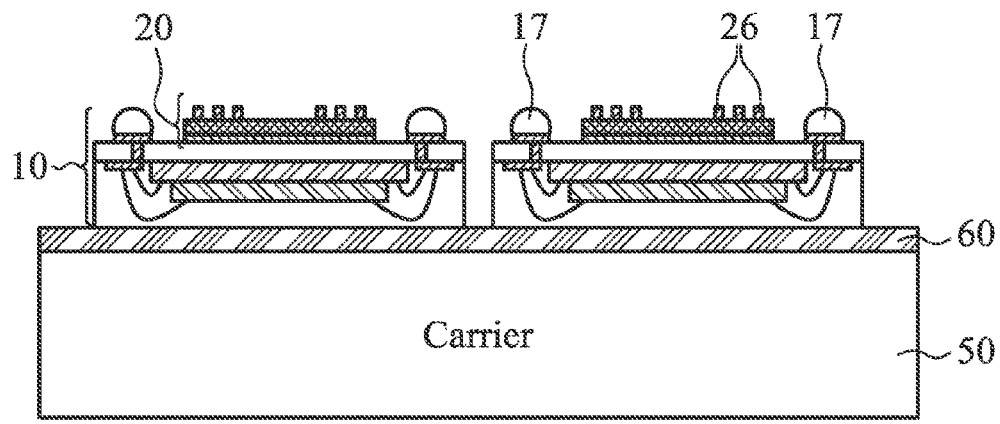

FIG. 2c illustrates a second chip placement step, where a plurality of embedded chips 20, e.g., an array of embedded chips 20, may be aligned with and placed onto the PoP dies 10. The embedded chips 20 may be formed and aligned appropriately on the PoP dies 10. As shown in FIG. 2c, each of the embedded chips 20 may be aligned and positioned around the center of the exposed surface of a PoP die 10, between the interconnects 17 (e.g., two solder balls) on the opposite sides of the PoP die 10. Similar to the placement step of the PoP dies 10, the embedded chips 20 may be formed on the PoP die 10 or placed using any suitable method of placing the embedded chips 20 onto the PoP die 10 and integrating the embedded chips 20 into a manufacturing process flow. In one embodiment, the embedded chips 20 (without the connector elements 26) may be attached to a transfer layer or substrate (not shown). The transfer layer may be utilized to place the embedded chips 20 over the PoP dies 10, e.g., using a flip-chip process. The placement of the embedded chips 20 may be performed by flipping the transfer layer (with the embedded chips 20 attached) and positioning the embedded chips 20 properly onto the PoP dies 10. The transfer layer may be removed after the embedded chips 20 have been flipped and placed on the PoP dies 10, for instance using a stripping or etching process to remove the material of the transfer layer from embedded chips 20. The connector elements 26 may then be placed on the surface of the embedded chips 20. The connector elements 26 in FIG. 2c may correspond to the pads 23 in FIG. 1 or may be any other suitable interconnect structures, such as bumps, bond pads, wire bonds, or the like.

Figure 2D:
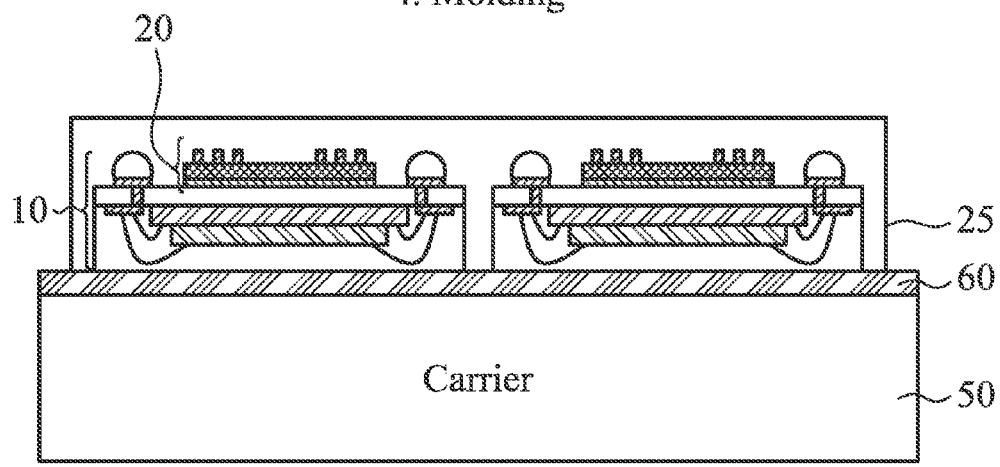

FIG. 2d illustrates a molding step, where the molding compound 25 may be formed to encapsulate the PoP dies 10 and the embedded chips 20 on the adhesive layer 60. The molding compound 25 may comprise a polymer, a molding underfill, the like, or a combination there of. The molding compound 25 may be formed by wafer level molding to envelope the PoP dies 10 and the embedded chips 20 (from the top and the sides) on the adhesive layer 60.

Figure 2E:
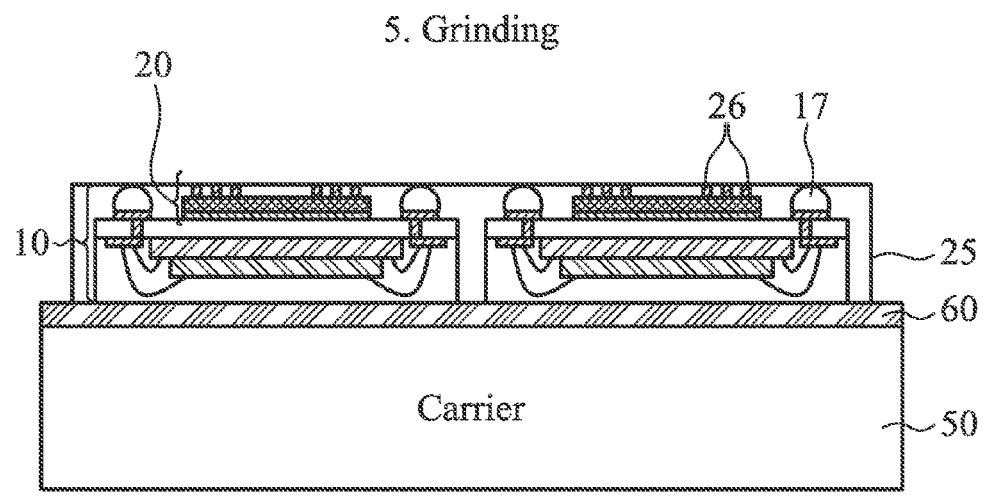

FIG. 2e illustrates a grinding step, where the molding compound 25 may be partially grinded or otherwise removed (e.g., etched) to expose connector elements 26 at the top surface of the embedded chips 20 and at least top portions of the interconnects 17 (e.g., solder balls) of the PoP dies 10. The thickness of the molding compound 25 may be reduced, for example, by a grinding or polishing process to expose the connector elements 26 and the interconnects 17.

Figure 2F:
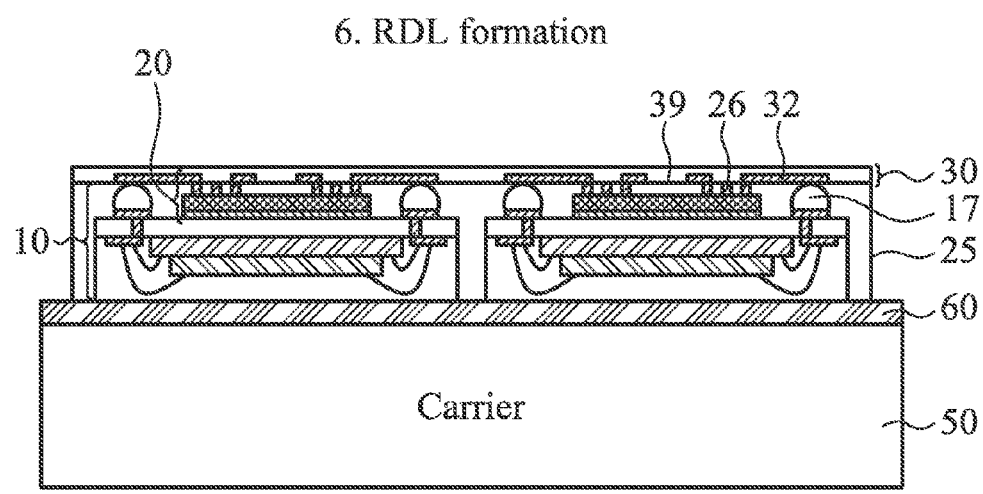

FIG. 2f illustrates a RDL formation step, where the RDL 30 may be formed on top of the thinned (or polished) molding compound 25, the connector elements 26, and the solder balls 17. The conductive layer 32 of the RDL 30 may be formed (e.g., deposited) and patterned (e.g., using lithography processes or steps) to be in contact with exposed top surface portions of connector elements 26 and the interconnects 17, as shown in FIG. 2f. A polymer layer 39 of the RDL 30 may be formed to extend along exposed top surfaces of the molding compound 25, the conductive layer 32, the connector elements 26, and the interconnects 17. The polymer layer 39 in FIG. 2f may correspond to the second polymer layer 31 and the third polymer layer 33 in FIG. 1.

Figure 2G:
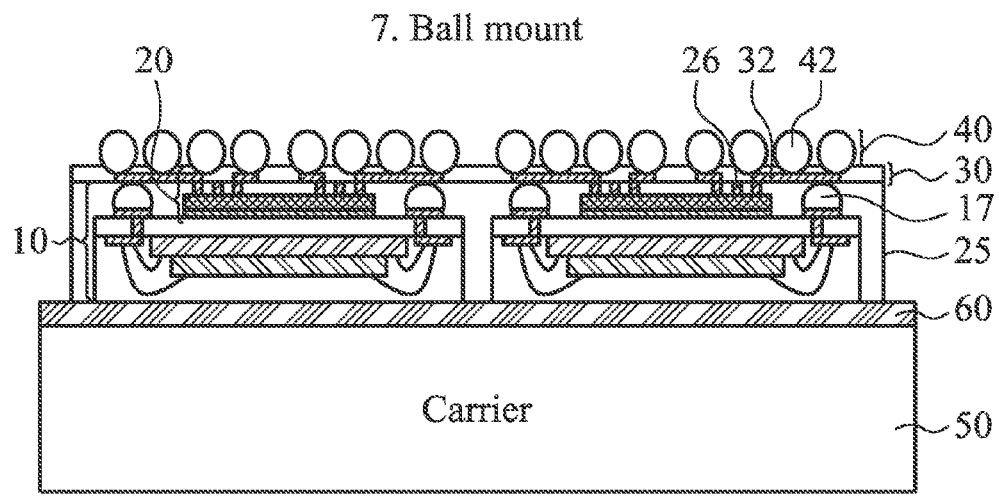

FIG. 2g illustrates a ball mount step, where the BGA 40 may be bonded to the RDL 30. The conductive elements 42 of the BGA 40 may be placed into contact with the conductive layer 32 of the RDL 30. In an embodiment, the BGA 40 may be coupled to the RDL 30 using a stencil print process. The conductive elements 42 of the BGA 40 may be coupled to UBM elements (not shown) in the RDL 30 that are formed on the conductive layer 32. The conductive elements 42 may be C4 bumps, micro bumps, or the like and may comprise a material such as tin, silver, lead-free tin, copper, the like, or a combination thereof. In another embodiment, the BGA 40 may be coupled to RDL 30 by another chip bonding process that does not utilize UBM elements in the RDL 30. The conductive layer 32 of the RDL 30 provides electrical coupling between the conductive elements 42 of the BGA 40 (on one side) and both the connector elements 26 of the embedded chips 20 and the interconnects 17 of the PoP dies 10. This removes the need of using a laminate interconnection layer to bond the chip/die package to the BGA to achieve a 3D fan-out structure, and hence reduces overall structure thickness, removes the need for forming through vias, and reduces cost.

Figure 2H:
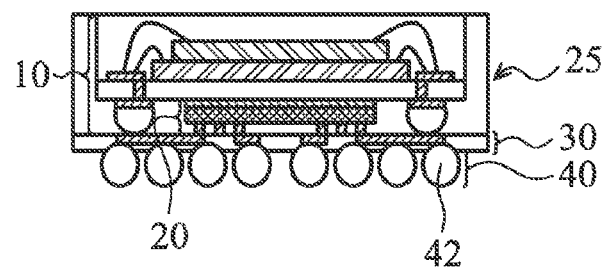

FIG. 2h illustrates removing the carrier 50 and adhesive layer 60 (not shown) and obtaining separate and individual chip/die packages. Each chip/die package may correspond to one PoP device 100 with a 3D fan-out structure, which may be, for example, to a memory chip component. To obtain a plurality of separate and similar 3D fan-out structures, the carrier 50 may be de-bonded (e.g., de-taped) from the remaining layers/components on top of the carrier 50. In an embodiment, the carrier 50 may be removed by dissolving or etching the adhesive layer 60 that bonds the carrier 50 to the packaged components/layers. When the carrier 50 is de-bonded or removed, the remaining bonded layers comprise the molding compound 25 encapsulating the PoP dies 10 and the embedded chips 20, the RDL 30, and the BGA 40.

To obtain a plurality of similar chip/die packages, a chip saw, patterned etch, laser, or the like step may then be implemented to separate the remaining bonded layers vertically along the lines between the adjacent PoP dies 10. The resulting individual chip/die packages may be flipped to obtain similar PoP devices 100 that have the 3D fan-out structure. The resulting PoP devices 100 may be separately sold, shipped, used, and/or integrated in devices or other packages. The PoP devices 100 may be integrated in devices or other packages, where the BGA 40 at the bottom is used to electrically couple components of the PoP die 10 and the embedded chip 22 to other devices or packages. For instance, a PoP device 100 (as shown in FIG. 2h) may be placed on top of another chip package or a PCB and may be electrically coupled to multiple components through the conductive elements 42 of the BGA 40.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package-on-package (PoP) device comprising:
a chip package with a first side and a second side opposite the first side, the chip package comprising a die on a first substrate and a first molding compound over the die and the first substrate, the die interposed between the first substrate and the first molding compound, the first substrate having a plurality of first through vias extending through the first substrate, the first molding compound fully electrically isolating the second side of the chip package;

an embedded chip bonded to the first side of the chip package with a bonding layer, the first through vias physically contacting the bonding layer and the die to form a thermally conductive connection between the embedded chip and the die, the embedded chip comprising a contact pad on a second substrate, a passivation layer on the second substrate and the contact pad, and a first polymer layer on the passivation layer, wherein edges of the second substrate, the passivation layer, and the first polymer layer are coterminous;

a second molding compound that encapsulates the chip package and the embedded chip, wherein the second molding compound extends along sidewalls of the first molding compound and the embedded chip;

a redistribution layer (RDL) extending over the second molding compound and the embedded chip, wherein the embedded chip is positioned between the RDL and the chip package, the embedded chip being directly connected to the RDL without solder, the chip package being connected to the RDL using solder, wherein the RDL comprises:

a second polymer layer adjacent the second molding compound and the embedded chip, the second polymer layer having a first opening and a second opening; and a conductive layer extending along a surface of the second polymer layer opposite the second molding compound, the conductive layer comprising a single continuous conductive layer, a first portion of the conductive layer extending a first distance from a first point in a first direction through the first opening, the first polymer layer, and the passivation layer to contact a contact pad of the embedded chip, a second portion of the conductive layer extending a second distance from a second point in the first direction through the second opening to contact the solder, the first distance greater than the second distance, wherein the first direction extends perpendicularly from a first plane within the second polymer layer toward the first substrate, the first plane being parallel with a major surface of the first substrate, the first point and the second point being in the first plane; and a ball grid array (BGA) coupled to the RDL, wherein the RDL is positioned between the BGA and the embedded chip.

2. The PoP device of claim 1, wherein the RDL provides electrical coupling between the BGA and the embedded chip without through vias.

3. The PoP device of claim 1, wherein the RDL provides electrical coupling between the BGA and the chip package, and wherein the RDL is positioned between the BGA and the chip package.

4. The PoP device of claim 1, wherein the chip package further comprises:

a plurality of conductive pads on both sides of the first substrate;

a plurality of second through vias in the first substrate that couple between the plurality of conductive pads on both sides of the first substrate; and a plurality of bonding wires encapsulated in the first molding compound, wherein the bonding wires couple the die to respective ones of the plurality of conductive pads;

wherein the solder is coupled to the plurality of conductive pads on one side of the first substrate opposite to the die and to the RDL.

5. The PoP device of claim 1, wherein
sidewalls of the bonding layer are fully covered by the second molding compound.

6. The PoP device of claim 1, wherein the bonding layer is an adhesive layer or a thermal interface material (TIM).

7. The PoP device of claim 5, wherein the RDL comprises:

a third polymer layer coupled to a surface of the conductive layer opposite to the first polymer layer.

8. The PoP device of claim 1, wherein the BGA comprises a plurality of conductive spheres coupled to a surface of the RDL opposite to the embedded chip.

9. The PoP device of claim 8, wherein the conductive spheres of the BGA are coupled to the RDL through a plurality of Under-Bump Metallization (UBM) elements positioned between the RDL and the BGA.

10. The PoP device of claim 1, wherein the embedded chip, the redistribution layer, and the chip package have a combined height of less than 575 μm.

11. A package-on-package (PoP) device comprising:

a chip package, the chip package comprising a die on a first substrate encapsulated by a first molding compound, a plurality of first through vias extending through the first substrate;

an embedded chip bonded to the first substrate of the chip package with a thermal interface material (TIM), the first through vias physically contacting the TIM and the die to form a thermally conductive connection between the embedded chip and the die;

a second molding compound disposed on sidewalls of the first molding compound and the embedded chip;

a redistribution layer (RDL) coupled to the embedded chip, wherein the embedded chip is embedded between the chip package and the RDL, a first area between the RDL and the chip package and adjacent the embedded chip having solder, the RDL comprising a first polymer layer extending over a surface of the second molding compound and the embedded chip, the RDL comprising a first conductive line and a second conductive line extending over a surface of the first polymer layer, the surface of the first polymer layer being an opposite surface from the embedded chip, the first conductive line extending from a first point in a first direction through the first polymer layer and a second polymer layer of the embedded chip, the second conductive line extending from a second point in the first direction through the first polymer layer to contact the solder, the first conductive line extending further in the first direction than the second conductive line, the first direction extending from the surface of the first polymer layer toward the first substrate of the chip package, the first point and the second point being on the surface of the first polymer layer, the first conductive line being a single continuous conductive line, wherein the RDL has a thickness of equal to or less than about 25 μm; and a ball grid array (BGA) coupled to the RDL, wherein the RDL provides electrical coupling between the BGA and both the chip package and the embedded chip without using through vias.

12. The PoP device of claim 11, wherein the RDL has a substantially reduced thickness in comparison to a laminate interconnection layer, and wherein the RDL is used for bonding the BGA to the embedded chip instead of the laminate interconnection layer.

13. The PoP device of claim 1, wherein the RDL has a thickness of about 25 μm.

14. A package-on-package (PoP) device comprising:
a chip package, the chip package comprising:
   one or more chips on a package substrate;
   plurality of first vias extending through the package substrate; and
   a first molding compound on the package substrate, the first molding compound extending along sidewalls of the one or more chips, the first molding compound electrically isolating each side of the chip package except for one;
an embedded chip coupled to the chip package, wherein the embedded chip comprises:
   a die, the die having a first side and a second side, the first side being opposite of the second side;
   a thermal interface material (TIM) on the first side of the die, the TIM being interposed between the die and the package substrate, the plurality of first vias physically contacting the TIM and a bottom chip of the one or more chips to form a thermally conductive connection between the die and the one or more chips;
   a plurality of conductive pads on the second side of the die; and
   a first polymer layer extending at least partially over the plurality of conductive pads;
a redistribution layer (RDL) coupled to the package substrate and to the embedded chip, the plurality of conductive pads being in direct contact with the RDL, the package substrate being coupled to the RDL using solder; and
a second molding compound on a third side of the RDL, the second molding compound extending along sidewalls of the first molding compound, the RDL comprising conductive lines and a second polymer layer interposed between the conductive lines and the embedded chip, first portions of the conductive lines extending from first points in a first direction through the first polymer layer and the second polymer layer to directly contact a first conductive pad of the plurality of conductive pads of the embedded chip, second portions of the conductive lines extending from second points in the first direction through the second polymer layer to contact the solder, the first portions of the conductive lines extending further in the first direction than the second portions of the conductive lines, each of the conductive lines comprising a single continuous layer extending over and through the second polymer layer, wherein the first direction extends perpendicularly from a first plane toward the package substrate of the chip package, the first plane located within the second polymer layer and being parallel with a major surface of the package substrate of the chip package, the first points and the second points being in the first plane.

15. The PoP device of claim 14, further comprising a ball grid array (BGA), the BGA being coupled to a fourth side of the RDL, the fourth side being opposite of the third side.

16. The PoP device of claim 14, wherein the chip package further comprises:
   a plurality of through vias in the package substrate; and
   a plurality of bonding wires encapsulated in the first molding compound, the plurality of bonding wires coupling the one or more chips to the plurality of through vias, wherein the solder is coupled to the plurality of through vias.

17. The PoP device of claim 14, wherein the first polymer layer is in direct contact with the RDL.

18. The PoP device of claim 17, wherein the RDL comprises:
   a third polymer layer coupled to the second polymer layer, the second polymer layer interposed between the first polymer layer and the third polymer layer.

19. The PoP device of claim 18, wherein the PoP device has a thickness of about 800 μm.

* * * * *